(12) United States Patent
Van Den Akker et al.

(10) Patent No.: US 7,812,930 B2
(45) Date of Patent: Oct. 12, 2010

(54) LITHOGRAPHIC APPARATUS AND DEVICE MANUFACTURING METHOD USING REPEATED PATTERNS IN AN LCD TO REDUCE DATAPATH VOLUME

(75) Inventors: Theodorus Leonardus Van Den Akker, Valkenswaard (NL); Martinus Hendricus Hendricus Hoeks, Breugel (NL); Pieter Willem Herman De Jager, Rotterdam (NL); Lambertus Gerardus Maria Kessels, Aalst-Waalre (NL); Marco Cornelis Jacobus Martinus Van Hassel, Zundert (NL); Frank Anton Morselt, Eersel (NL)

(73) Assignee: ASML Netherlands B.V., Veldhoven (NL)

( * ) Notice: Subject to any disclaimer, the term of this patent is extended or adjusted under 35 U.S.C. 154(b) by 864 days.

(21) Appl. No.: 11/084,866

(22) Filed: Mar. 21, 2005

(65) Prior Publication Data

US 2006/0209313 A1    Sep. 21, 2006

(51) Int. Cl.
G03B 27/32 (2006.01)
(52) U.S. Cl. ...................................... 355/77
(58) Field of Classification Search ................ 355/75, 355/53, 77; 359/259; 430/5
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,528,048 | A | 6/1996 | Oae et al. |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,373,619 | B1 * | 4/2002 | Sandstrom .................. 359/298 |
| 6,687,041 | B1 | 2/2004 | Sandstrom |
| 6,687,895 | B2 * | 2/2004 | Zhang ......................... 716/19 |

(Continued)

FOREIGN PATENT DOCUMENTS

JP    7-335521 A    12/1995

(Continued)

OTHER PUBLICATIONS

Translation of JP 07-335521. Dec. 1995.*

(Continued)

*Primary Examiner*—Peter B Kim
*Assistant Examiner*—Chia-how Michael Liu
(74) *Attorney, Agent, or Firm*—Sterne, Kessler, Goldstein & Fox P.L.L.C.

(57) ABSTRACT

A method and device for programming an array of individually controllable elements configured to impart a beam with a pattern. For example, the method can be suitable for use in a lithographic apparatus. The method includes generating first data representing a first pattern, generating second data representing a second pattern, writing the first data to a first buffer, and reading the first data from the first buffer to program the array of individually controllable elements to display the first pattern, while writing the second data to a second buffer in parallel.

16 Claims, 5 Drawing Sheets

U.S. PATENT DOCUMENTS

| | | |
|---|---|---|
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/33096 | 7/1998 |
| WO | WO 98/38597 | 9/1998 |

OTHER PUBLICATIONS

Notification of Reasons for Refusal for Japanese Patent Application No. 2006-076886 mailed Jun. 16, 2009, 3 pgs.

\* cited by examiner

FIG. 4

LITHOGRAPHIC APPARATUS AND DEVICE MANUFACTURING METHOD USING REPEATED PATTERNS IN AN LCD TO REDUCE DATAPATH VOLUME

BACKGROUND

1. Field

The present invention relates to a lithographic apparatus and a device manufacturing method. The present invention also relates to devices and methods for programming an array of individually controllable elements configured to modulate a beam of radiation.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), and other devices involving fine structures. In a conventional apparatus, a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

When using maskless lithography each target portion of the substrate is written in discrete units known as pixels. In one example, each pixel will typically have a size of about 30 nm. The patterning device typically includes an array of individually controllable elements. A plurality of pixels will be written at a time, with each pixel corresponding to an individually controllable element. Between writing to adjacent target portions of a substrate, the patterning device may need to be reconfigured, so as to write a different plurality of pixels to different target portions. In order to rapidly pattern the substrate, it is necessary to reconfigure the patterning device relatively quickly. It is difficult to program the pattern means at such data rates, and accordingly, the programming of the patterning device becomes a rate limiting step in a lithographic process.

Therefore, what is needed is a system and method that improve performance of maskless lithography systems through reduction of pattern data needed in a datapath to a pattern generator.

SUMMARY

According to one embodiment of the present invention, there is provided a method including the following steps. Storing data representing a pattern that is used to program an array of individually controllable elements, which modulate a beam of radiation used in a lithographic apparatus. The pattern is divided into a plurality of regions. An identifier is assigned corresponding to a portion of the pattern to each of the plurality of regions. The portion of the pattern corresponding to each unique identifier is stored.

In one example, at least one of the identifiers and the corresponding portion of the pattern can define a display pixel area.

In one example, the identifiers can comprise a matrix having an entry corresponding to each of the plurality of regions.

In one example, at least one of the identifiers can be repeated a plurality of times in the matrix. Only one instance of the portion of the pattern for each identifier can be stored, regardless of the number of times each identifier appears in the matrix.

In one example, each of the plurality of regions can comprise an integer number of display pixels, where the portion of the pattern corresponding to those display pixels comprising a fixed-size bitmap.

In one example, the total number of regions can be chosen in accordance with the available memory storage space.

According to one embodiment of the present invention, there is provided a method of programming an array of individually controllable elements that modulate a beam of radiation the pattern, comprising the following steps. Storing the pattern. Providing a buffer with at least one of the portions of the pattern. Transferring the portion of each of the patterns from the buffer to a control device for actuating the array in accordance with each portion of the pattern.

In one example, the portion of the pattern held in the buffer defines a display pixel area.

In one example, a plurality of buffers are used, each buffer comprising a memory and a data processing device that decompress data connected to the output of the memory. The memory of at least one of the buffers is further connected to the input of the data processing device of a different buffer. The transferring step comprises transferring the portion of the pattern from the at least one buffer to the different buffer prior to transferring the portion of the pattern to the control device.

In one example, the transfer of data between the at least one buffer and the different buffer can be carried out in accordance with a resource schedule. The resource schedule can be generated based upon the extent of compression of the pattern data. The resource schedule can be generated offline or dynamically whilst the array is being programmed.

According to one embodiment of the present invention, there is provided an apparatus for storing a pattern used to program an array of individually controllable elements that modulate a beam. The apparatus comprises a dividing device, an assigning device, and a storage device. The dividing device divides the pattern into a plurality of regions. The assigning device assigns an identifier corresponding to a portion of the pattern to each of the plurality of regions. The storage device stores the portion of the pattern corresponding to each unique identifier.

In one example, the apparatus also comprises a storage device for storing the pattern, at least one buffer for storing at least one of the portions of the pattern; and transferring device that transfers the or each portion of the pattern from the or each buffer to a control device to actuate the array in accordance with the or each portion of the pattern.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

FIG. 4 is a portion of the substrate of FIG. 3, according to one embodiment of the present invention.

Figure 1:
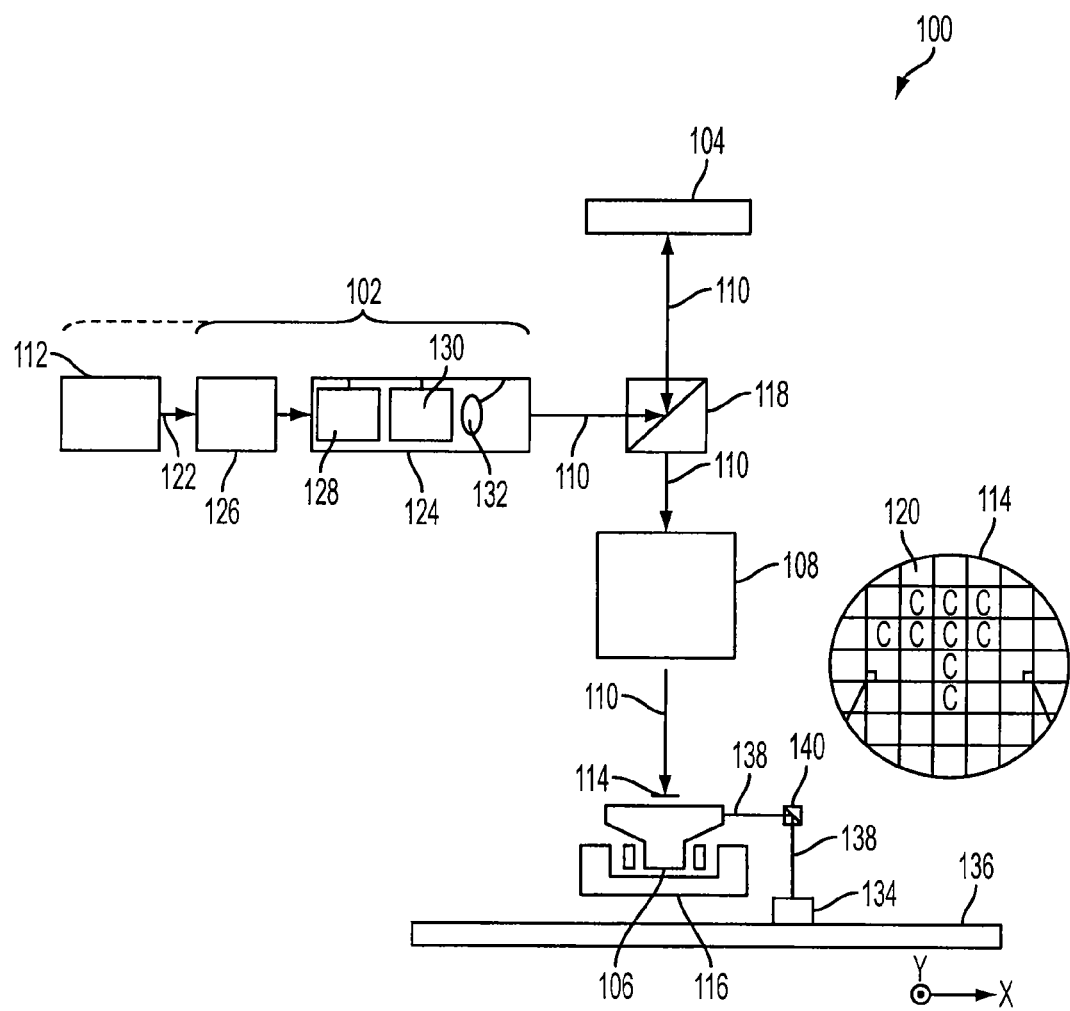
FIG. 1 depicts a lithographic apparatus, according to one embodiment of the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

Overview and Terminology

The terms "contrast device", "patterning device", "patterning array", or "array of individually controllable elements" used herein should be broadly interpreted as referring to any device that can be used to modulate the cross-section of a radiation beam such as to create a pattern in a target portion of the substrate. It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

A programmable LCD array is another example. Programmable LCD arrays are described in, for example, U.S. Pat. No. 5,229,872, which is incorporated herein by reference in its entirety.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g., to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

FIG. 1 schematically depicts a lithographic projection apparatus 100 according to an embodiment of the invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or CaF$_2$ lens system or a catadioptric system comprising lens elements made from such materials, or a mirror system) can be used for projecting the patterned beam received from a beam splitter 118 onto a target portion 120 (e.g., one or more dies) of substrate 114. Target portions C depict different target portions that have already been exposed to the patterned beam. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
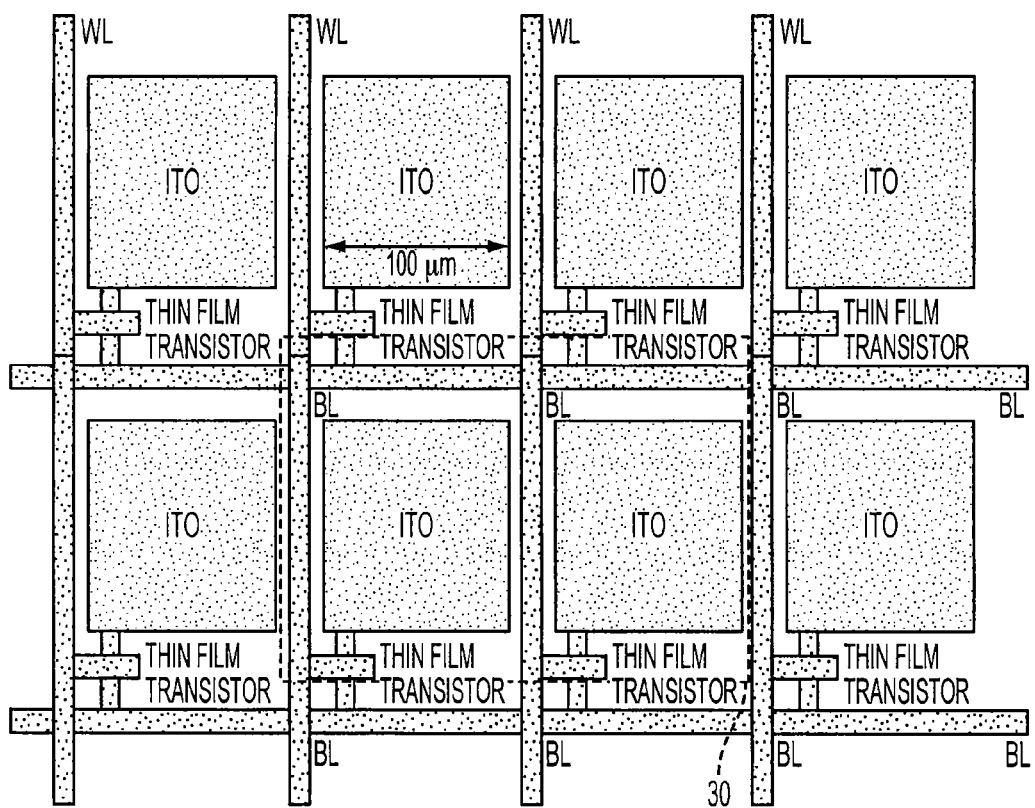
FIG. 2 is an illustration of structures written to a substrate to create a flat panel display, according to one embodiment of the present invention.

FIG. 2 is an illustration of structures 30 written to a substrate to create a flat panel display, according to one embodiment of the present invention. In one example, for an about 2.6 m×2.8 m substrate (e.g., typical of the dimensions of a flat panel display substrate) containing n displays, having square pixels about 0.25 μm×0.25 μm, pattern data comprises a bitmap image of the order of about 15 terabytes in size. This bitmap image has to be stored in the memory of a datapath and provided to a patterning device, similar to those described above. The pattern is printed with a laser rate of about 50 kHz, so one setpoint per actuator per laser interval (e.g., about 20 μs) is provided to the patterning device. Assuming that the patterning device has n actuators, the datapath has to provide n setpoints to the patterning device each about 20 μs interval. The minimum feature size in the pattern data is about 2.5 μm. In one example, the pattern data can be compressed to a bitmap of the order of about 5 terabytes in size. In certain embodiments, the data is stored as gray tone pixels of about 750 nm×750 nn, and therefore the amount of data can be further reduced.

In order to drive the actuators, the whole bitmap must be provided. Similarly, whenever the pattern to be printed changes, the whole bitmap must be updated. Fast accessible memory is therefore required, and about 5 terabytes of such memory can make a lithographic system prohibitively expensive.

FIG. 2 shows a part of a flat panel display having a plurality of identical structures 30, each structure 30 covering an area greater than an area covered by a single patterned beam. As will be appreciated from FIG. 2, the pattern data storage requirements can be significantly reduced by realizing that a large proportion of the area is made up of a tiled arrangement of the same identical structure 30.

For LCDs, depending on the display type, the LCD pixel size can vary. The LCD pixel aspect ratio is generally 1:3 because one LCD pixel consists of 3 colors: red, greed and blue. This means an LCD pixel of about 300×300 μm has 3 structures of about 100×300 μm for the 3 different colors. One such structure 30 corresponds to a single display pixel. In this example, about 95% of a typical display area is covered by patterns of display pixels, or by empty space. About 5% of the substrate area is covered by display borders that contain non-repeating patterns. On the order of a 20-fold reduction in memory requirements can therefore be made.

A result of the large amount of memory sometimes required to store an entire pattern bitmap image is that the large fluctuations in the cost of cyclic DRAM can significantly change the cost of the lithography apparatus. Furthermore, the power consumption of such a system is of the order of about 34 kW, and large amounts of cooling equipment may be needed. Consequently, the lithography apparatus can become very large.

Figure 3:
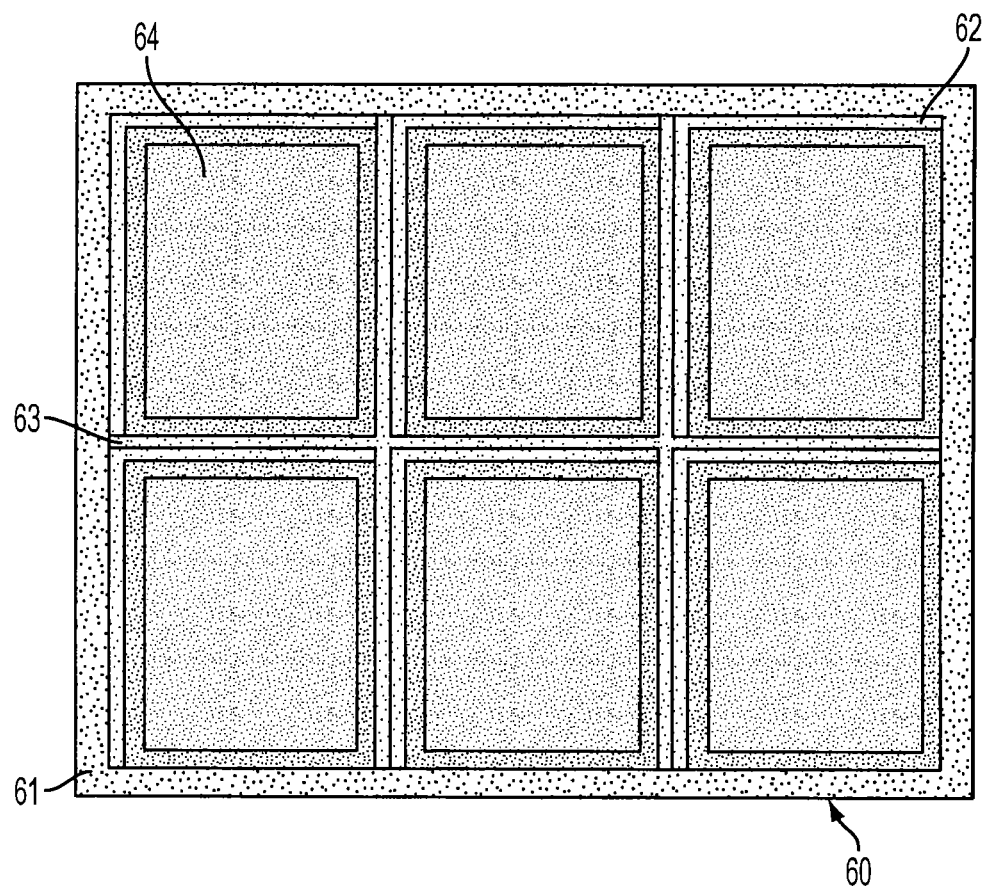
FIG. 3 is an illustration of a flat panel display substrate, according to one embodiment of the present invention.

FIG. 3 is an illustration of a typical flat panel display substrate 60, according to one embodiment of the present invention. The substrate 60 comprises a handling area 61 that does not contain any pattern data. An outer lead bonding border 62 and a scribe in area 63 distinguishes the separate display pixels 64. It is assumed that all of the display pixels 64 are identical in terms of size and pattern, and are located on a well-defined grid on substrate 60. The scribe line area 63 can contain marker or test patterns for measuring line width accuracy. It is further assumed that the lead bonding border 62 and scribe line area do not contain a repeating data, so will not contribute to reduction in the bitmap size.

In this example, the substrate area can be categorized into three regions: (i) display pixel areas that contain repeating patterns; (ii) border areas that contain patterns without repetition; and (iii) empty areas with no patterns (e.g., the handling area 61). Only a small part of the substrate area falls into category (ii), typically of the order of about 0.5% to 5%. The obtainable compression ratio for pattern data can therefore be of the order of about 20 to 200.

Figure 4:
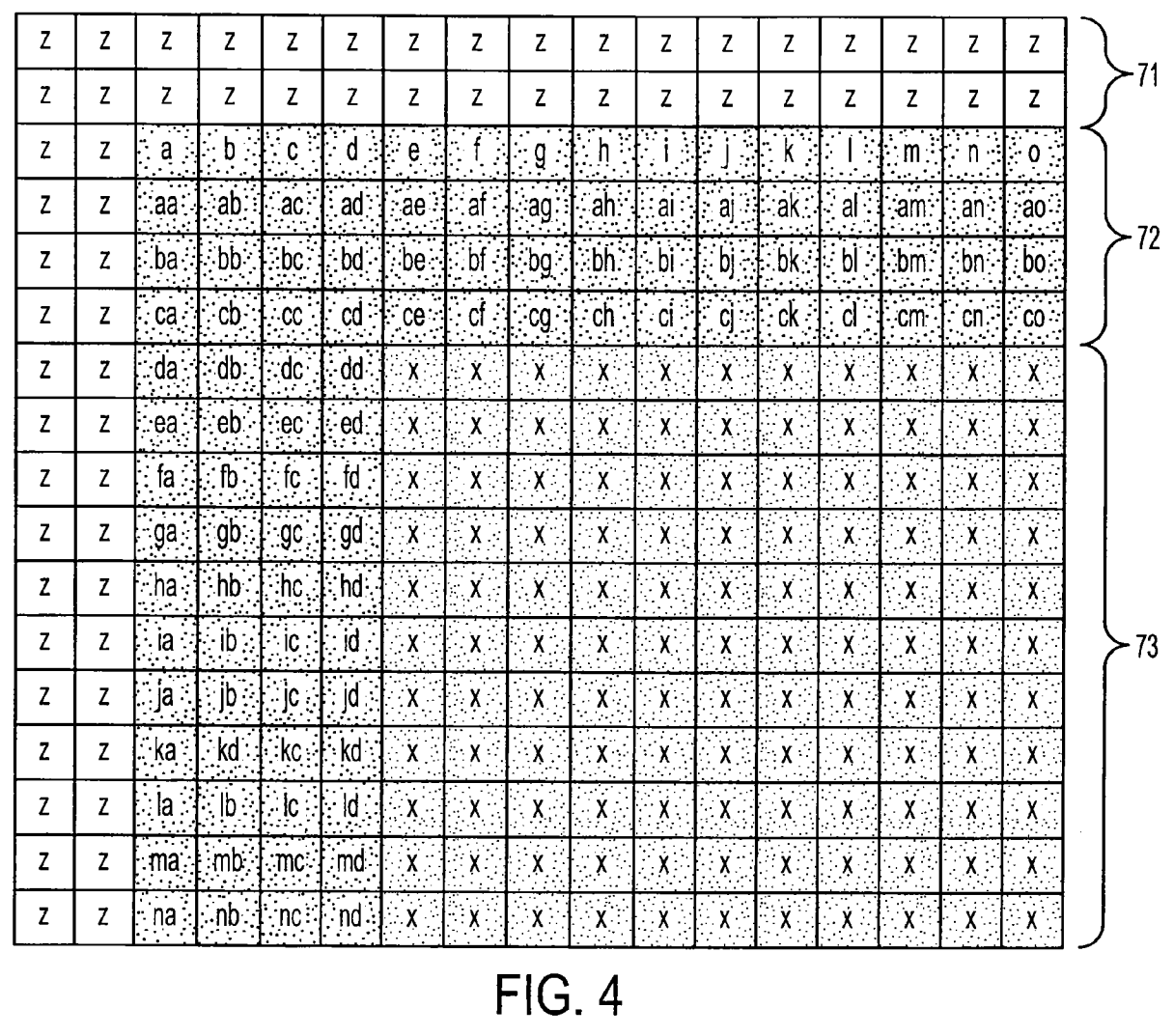

FIG. 4 is a portion of the substrate 60, according to one embodiment of the present invention. In this embodiment, in order to achieve a reduction in memory requirements, the substrate area is divided into a grid of bitmap blocks. A bitmap block is a fixed-size bitmap and comprises one or more display pixels. That is, a bitmap block contains an integer number of display pixels, e.g., 1 pixel, a 6×6 grid of pixels, or the like. In one example, a total number of bitmap blocks on the substrate area can be limited in line with memory requirements.

FIG. 4 shows three different types of bitmap block: empty blocks 71, border blocks 72, and display pixel blocks 73, corresponding to regions (iii), (ii) and (i), respectively, discussed above. In this example, all bitmap blocks are coded with identifiers, so that the entire substrate area can be written as a matrix of identifiers. For example, at least 95% of the entries will have identical identifiers, corresponding to the display pixel bitmap blocks, which are coded with the identifier "x." The idea is that memory can be saved by preserving repetition. The empty bitmap blocks are all coded with the identifier "z," while the border bitmap blocks are each coded with unique identifiers. A matrix of identifiers is then generated and stored, corresponding to the substrate layout. The matrix of identifiers is used to call the corresponding bitmap block image, and therefore the display pixel bitmap blocks are only stored once.

As an example of the memory requirement reduction, an about 2.9 m×3.0 m substrate, split into about 300 μm×300 μm bitmap blocks, will have approximately 100 million bitmap blocks and a matrix of identifiers with about 100 million entries. The maximum number of unique bitmap blocks is approximately 5% of 100 million, which is about 5 million. In order to identify 5 million blocks, about 23 bit accuracy is required for sake of argument, taking about 24 bit accuracy allows $2^{24}$ or 16 million unique bitmap blocks to be identified, i.e., up to 16% of the substrate area can be non-repeating. Therefore, the matrix of identifiers takes about 100 million× about 24 bits=about 300 MB of memory. The storage required for the unique bitmap blocks is approximately 200 GB. Thus, in this example a total memory requirement has been reduced from 5 TB to about 200 GB, i.e., about a 95% reduction. If the substrate has, e.g., k identical substrates in the scan direction, this reduction might even be a factor k lower (because the bitmap blocks for the periphery of the displays only need to be stored once). The compression achieved this way is substantially lossless.

Figure 5:
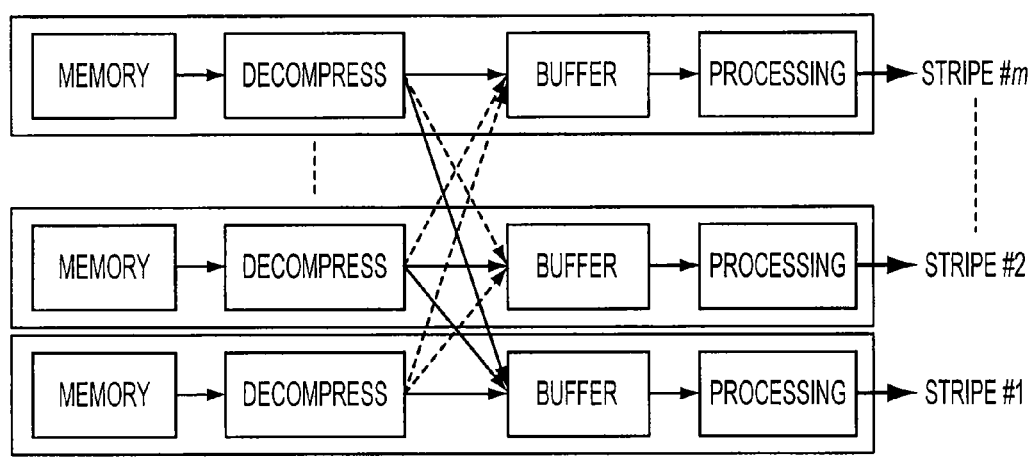
FIG. 5 is an illustration of processing boards, according to one embodiment of the present invention.

FIG. 5 is an illustration of processing boards, according to one embodiment of the present invention. A display substrate is exposed by a plurality of optical columns and the required data stream to feed these optical columns is in the order of about 100 GB/s. This requires many processing boards that operate in parallel, each processing a stripe of the substrate pattern as shown in FIG. 5. In one example, there are 17 optical columns, each having 3 or 4 processing boards, giving a total of between 51 and 68 processing boards. There are of the order of about 68 parallel data streams making up the entire 100 GB/s data stream feeding the optical columns. The data stream is divided into m substreams and applied to the substrate via m processing boards, which control a control device that actuates a patterning device.

In one example, each processing board is identical and has local memory on board. Each board also has a device that allows for decompressing the compressed pattern data in order to feed the optical columns. The board handling stripe #1 of FIG. 5 does not implement very much data compression because that board handles the pattern data corresponding to the periphery of the display area (which contains a non-repeating pattern), and actually requires more memory than the other processing boards to handle the less compressed data. Therefore, in order to make generic processing boards, it is necessary to equip each board with enough memory to handle the peripheral portion of the substrate, reducing the compression factor and simultaneously increasing the system cost due to the extra storage memory requirements.

In one example, inter-board communication is provided. Communication channels between the boards enables data exchange between the boards, so that the board that is handling stripe #1 does not have to store all the data itself, but can receive data from other processing boards. In this way, the memory requirements can be reduced. Spare memory capacity on boards handling highly compressed data (i.e., very repetitive data) can be used to store and provide data to those processing boards dealing with less-compressed data.

In this example, the principle involves carrying out decompression at one board prior to sending the data to other boards. It is also possible to send the data to another board and decompress the data on that board. It is possible that each of the m boards has (m−1) connections to the remaining boards, which are referred to as a "full mesh" configuration. It is also possible to make a "partial mesh," such that, for example, only a subset of the m boards are interconnected (and hence memory can only be shared among this subset of boards). It is to be appreciated that other interconnection topologies are possible (e.g., a shared bus, a switched network, or the like). After decompression there is provided a memory buffer on each board for holding the decompressed data and providing that data to the processing device. The decompression stream might vary in data rate, and the processing device uses a steady data rate. In this example, the memory buffer interconnects these two data streams.

The interconnections between the boards are shown in FIG. 5 as the solid arrows between the decompression stages and buffers. The dashed arrows denote the communication channels present in the mesh configuration, but not used in the example given above with the board handling stripe #1 carrying little compressed data.

In one example, when the patterning device is being provided with large amounts of data, for example a large number of non-repeating bitmap patterns, the demand for memory bandwidth and storage cache can peak at maximum tolerance levels of the system. Certain data streams, such as those corresponding to the border areas of the bitmap that lie in the scan direction, can be constantly updated and therefore be permanently at its maximum data transfer level. In one example, to avoid this, prior to the substrate being printed, an analysis of the substrate layout can be undertaken to identify all possible bottlenecks. This analysis can generate a resource schedule that levels the peaks in memory usage in time and/or geometrical space. In one example, leveling in time can be achieved by applying bus multiplex techniques. In another example, leveling in space can be achieved by making the width of a data stream dependent on the amount of work it has to do for the scan.

In this example, resource scheduling is the process of determining which bitmap block is to be stored on which board, and ensuring that the decompressed data is passed to the correct board. The resource schedule manages the storage of data across the plurality of processing boards. The patterns for stripe #1 (or any other stripes containing less-compressed data) are divided among other boards, so that those other boards send the data to the board that is handling stripe #1. Scheduling is typically done off line, but real-time scheduling can also be effected through use of a suitable scheduling computer. It is possible to include information in the resource schedule about which board each bitmap block should be delivered to. It is also possible to exclude this information, such that the decompression stage simply broadcasts each bitmap block with an associated block identification number to all of the other processing boards via the interconnected mesh. The receiving processing boards can determine whether they need the received bitmap block or not by checking the identification number. Based upon the check, the receiving board can either the received bitmap block in the buffer or discard it.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method, comprising:
   dividing a pattern into regions, each of the regions including a sub-pattern, wherein portions of a group of the regions each include a common sub-pattern;
   assigning an identifier to each of the sub-patterns;
   storing a matrix in a tangible computer data storage medium, each entry of the matrix corresponding to a respective one of the regions and including a respective one of the identifiers that identifies a respective one of the sub-patterns included in the respective one of the regions, wherein the entries of the matrix corresponding to the portions of the group of the regions include a same identifier;
   storing only one instance of the common sub-pattern in the storage;
   providing a plurality of buffers configured to store at least one of the sub-patterns;
   transferring each of the at least one of the sub-patterns from the plurality of buffers to a controller; and
   actuating an array of individually controllable elements with the controller in accordance with the at least one of the sub-patterns,
   wherein the transferring comprises transferring the at least one portion of the pattern from at least one buffer of the plurality of buffers to a different buffer of the plurality of buffers prior to transferring the at least one portion of the pattern to the controller.

2. The method of claim 1, wherein at least one of the sub-patterns defines a display pixel area.

3. The method of claim 1, further comprising:
   storing only one instance of each of the sub-patterns in the storage, regardless of the number of times each of the sub-patterns appears in the pattern.

4. The method of claim 1, wherein each of the sub-patterns comprises a fixed size bitmap.

5. The method of claim 1, wherein a total number of the regions is chosen in accordance with available memory storage space.

6. The method of claim 1, wherein the at least one of the sub-patterns held in the at least one buffer defines a display pixel area.

7. The method of claim 1, further comprising:
   forming each of the plurality of buffers with a memory and a data processor, wherein the data processor decompresses data and is coupled to an output of the memory; and
   coupling the memory of at least one of the plurality of buffers to an input of a data processor of a different one of the plurality of buffers.

8. A method, comprising:
   storing in a tangible computer data storage medium, data representing a pattern used to generate a beam;
   dividing the pattern into a plurality of regions;
   assigning an identifier corresponding to a portion of the pattern to each of the plurality of regions;
   storing in the tangible computer data storage medium, the portion of the pattern corresponding to each unique identifier;
   providing a plurality of buffers that store at least one of the portions of the pattern;
   transferring each portion of the pattern from the plurality of buffers to a controller;
   actuating the array with the controller in accordance with the at least one of the portions of the pattern;
   forming each of the plurality of the at least one buffer buffers with a memory and a data processor, wherein the data processor decompresses data and is coupled to an output of the memory; and
   coupling the memory of at least one buffer of the plurality of buffers to an input of a data processor of a different one of the plurality of buffers,
   wherein the transferring comprises transferring the at least one portion of the pattern from the at least one buffer to the different buffer prior to transferring the at least one portion of the pattern to the controller.

9. The method of claim 8, further comprising:
   using a resource schedule to carry out the transfer of data between the at least one buffer and the different buffer.

10. The method of claim 9, wherein the resource schedule is generated based upon the extent of compression of the pattern data.

11. The method of claim 9, wherein the resource schedule is generated offline.

12. The method of claim 9, wherein the resource schedule is generated dynamically while the array is being programmed.

13. An apparatus, comprising:
    a divider configured to divide a pattern used to adjust a patterning device into a plurality of regions, each of the regions including a sub-pattern, wherein portions of a group of the regions each include a common sub-pattern;
    an assigning device configured to assign an identifier to each of the sub-patterns;
    a storage device configured to store:
      a matrix, each entry of the matrix corresponding to a respective one of the regions and including a respective identifier that identifies a respective one of the sub-patterns included in the respective region, wherein entries of the matrix corresponding to the portions of the group of regions include a same identifier, and
      only one instance of the common sub-pattern;
    a plurality of buffers configured to store at least one of the sub-patterns; and
    a transferring device configured to transfer each of the at least one of the sub-patterns from the plurality of buffers to a controller, wherein the controller actuates the patterning device in accordance with the at least one of the sub-patterns, wherein the transferring device is further configured to transfer the at least one portion of the pattern from at least one buffer of the plurality of buffers to a different buffer of the plurality of buffers prior to transferring the at least one portion of the pattern to the controller.

14. The apparatus of claim 13, wherein each of the plurality of buffers is comprised of a memory and a data processor, wherein the data processor decompresses data and is coupled to an output of the memory, and the output of the memory of at least one of the plurality of buffers is coupled to an input of a data processor of a different one of the plurality of buffers.

15. A lithographic apparatus, comprising:

a system configured to generate a beam in accordance with a pattern, wherein the pattern includes regions, wherein each of the regions includes a sub-pattern, and wherein portions of a group of the regions each include a common sub-pattern;

a projection system configured to project the generated beam onto a target portion of a substrate;

a storage device configured to store:

a matrix, each entry of the matrix corresponding to a respective one of the regions and including a respective identifier that identifies a respective one of the sub-patterns included in the respective region, wherein the entries of the matrix corresponding to the portions of the group of regions include a same identifier, and only one instance of the common sub pattern. sub-pattern;

a plurality of buffers configured to store at least one of the sub-patterns; and a transferring device configured to transfer each of the at least one of the sub-patterns from the plurality of buffers to a controller, wherein the controller actuates the patterning device in accordance with the at least one of the sub-patterns, wherein the transferring device is further configured to transfer the at least one portion of the pattern from the at least one buffer to the different buffer prior to transferring the at least one portion of the pattern to the controller.

16. The lithographic apparatus of claim 15, wherein each of the plurality of buffers is comprised of a memory and a data processor, wherein the data processor decompresses data and is coupled to an output of the memory, and the output of the memory of at least one of the plurality of buffers is coupled to an input of a data processor of a different one of the plurality of buffers.

* * * * *

UNITED STATES PATENT AND TRADEMARK OFFICE
CERTIFICATE OF CORRECTION

PATENT NO. : 7,812,930 B2  Page 1 of 1
APPLICATION NO. : 11/084866
DATED : October 12, 2010
INVENTOR(S) : Van Den Akker et al.

It is certified that error appears in the above-identified patent and that said Letters Patent is hereby corrected as shown below:

In claim 8, column 12, line 24, please delete "the at least one buffer"
In claim 15, column 14, line 5, please delete "."

Signed and Sealed this

Twenty-first Day of December, 2010

David J. Kappos
*Director of the United States Patent and Trademark Office*